United States Patent
Liu et al.

(10) Patent No.: US 8,866,204 B2
(45) Date of Patent: Oct. 21, 2014

(54) METHOD TO FORM FINFET/TRIGATE DEVICES ON BULK SEMICONDUCTOR WAFERS

(71) Applicants: STMicroelectronics, Inc., Coppell, TX (US); International Business Machines Corporation, Armonk, NY (US)

(72) Inventors: Qing Liu, Guilderland, NY (US); Junli Wang, Slingerlands, NY (US)

(73) Assignees: STMicroelectronics, Inc., Coppell, TX (US); International Business Machines Corporation, Armonk, NY (US)

(*) Notice: Subject to any disclaimer, the term of this patent is extended or adjusted under 35 U.S.C. 154(b) by 31 days.

(21) Appl. No.: 13/754,614

(22) Filed: Jan. 30, 2013

(65) Prior Publication Data

US 2014/0210010 A1    Jul. 31, 2014

(51) Int. Cl.
*H01L 21/82* (2006.01)
*H01L 27/088* (2006.01)

(52) U.S. Cl.
CPC ............ *H01L 21/82* (2013.01); *H01L 27/0886* (2013.01)
USPC ........... 257/288; 257/296; 257/347; 257/350; 257/618; 257/E21.409; 257/E27.084; 257/E29.004; 257/E33.001

(58) Field of Classification Search
CPC ............................. H01L 21/82; H01L 27/0886
USPC .......... 257/288–296, 347–350, 618, E21.409, 257/27.084, 29.004, 33.001
See application file for complete search history.

(56) References Cited

U.S. PATENT DOCUMENTS

| | | | |
|---|---|---|---|
| 7,265,031 B2* | 9/2007 | Oh et al. ................. | 438/459 |
| 2007/0138523 A1* | 6/2007 | Popp et al. .............. | 257/296 |
| 2007/0284632 A1* | 12/2007 | Kim et al. ................ | 257/288 |
| 2008/0079003 A1* | 4/2008 | Shaheen et al. ......... | 257/64 |
| 2008/0157182 A1* | 7/2008 | Song et al. ............... | 257/321 |
| 2009/0162995 A1* | 6/2009 | Ohmi et al. .............. | 438/471 |
| 2010/0025775 A1* | 2/2010 | Giles et al. .............. | 257/386 |
| 2010/0041224 A1* | 2/2010 | Park et al. ............... | 438/591 |
| 2010/0127328 A1* | 5/2010 | Oh et al. .................. | 257/347 |
| 2010/0258868 A1* | 10/2010 | Yin et al. ................. | 257/347 |
| 2011/0233734 A1* | 9/2011 | Wells ....................... | 257/618 |
| 2013/0099295 A1* | 4/2013 | Baars et al. .............. | 257/288 |
| 2013/0228833 A1* | 9/2013 | Xiao et al. ............... | 257/288 |
| 2013/0277757 A1* | 10/2013 | Yuan et al. ............... | 257/386 |

* cited by examiner

*Primary Examiner* — Michael Lebentritt
(74) *Attorney, Agent, or Firm* — Allen, Dyer, Doppelt, Milbrath & Gilchrist, P.A.

(57) ABSTRACT

A method for fabricating a finFET device having an insulating layer that insulates the fin from a substrate is described. The insulating layer can prevent leakage current that would otherwise flow through bulk semiconductor material in the substrate. The structure may be fabricated starting with a bulk semiconductor substrate, without the need for a semiconductor-on-insulator substrate. Fin structures may be formed by epitaxial growth, which can improve the uniformity of fin heights in the devices.

13 Claims, 7 Drawing Sheets

METHOD TO FORM FINFET/TRIGATE DEVICES ON BULK SEMICONDUCTOR WAFERS

BACKGROUND

1. Technical Field

The technology relates to methods and structures for making insulated fin-field-effect transistors on bulk semiconductor wafers.

2. Discussion of the Related Art

Transistors are fundamental device elements of modern digital processors and memory devices. Currently, there are a variety of transistor designs or types that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and superjunction or multi-drain transistors. One type of transistor that has emerged within the MOSFET family of transistors is a fin field-effect transistor (finFET).

Figure 1A:
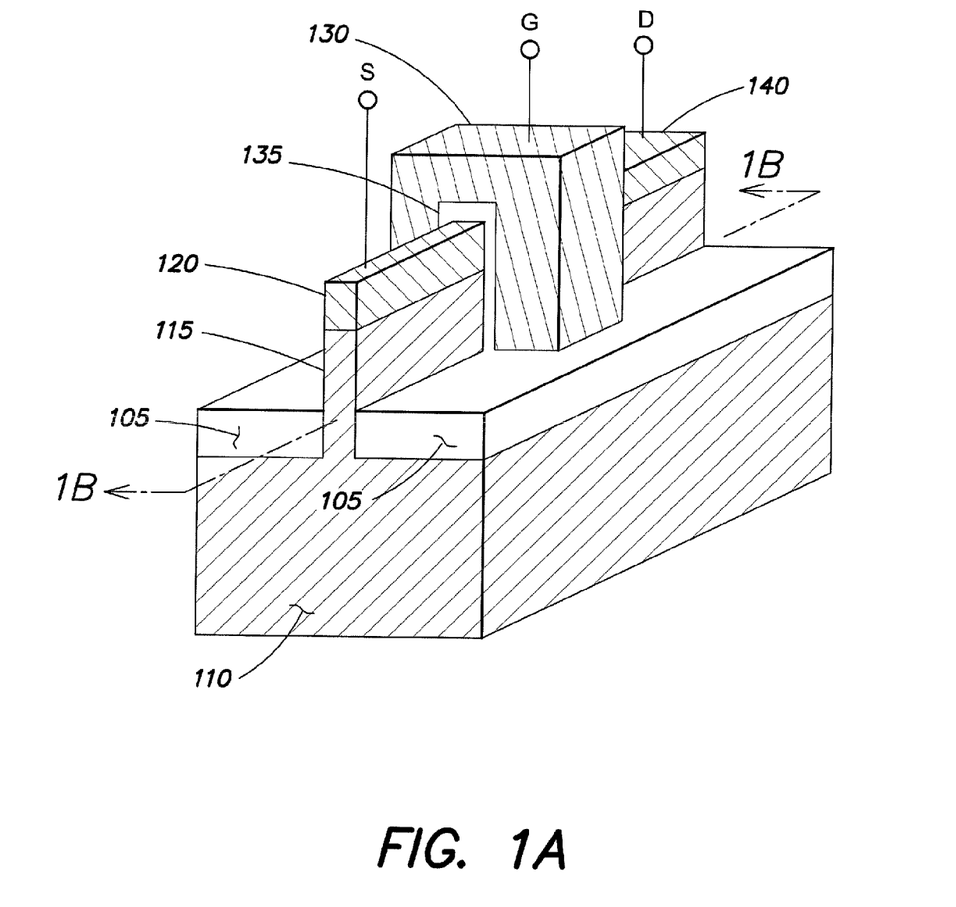
FIG. 1A is a perspective view of a finFET formed on a bulk substrate.

An example of a finFET is depicted in the perspective view of FIG. 1A. A finFET may be fabricated on a bulk semiconductor substrate 110, e.g., a silicon substrate, and comprise a fin-like structure 115 that runs in a length direction along a surface of the substrate and extends in a height direction normal to the substrate surface. The fin 115 may have a narrow width, e.g., less than 250 nanometers. There may be an insulating layer 105, e.g., an oxide layer, on a surface of the substrate. A gate structure comprising a conductive gate material 130 and gate insulator 135 may be formed over a region of the fin. A source region 120 and drain region 140 may be formed adjacent the gate.

Figure 1B:
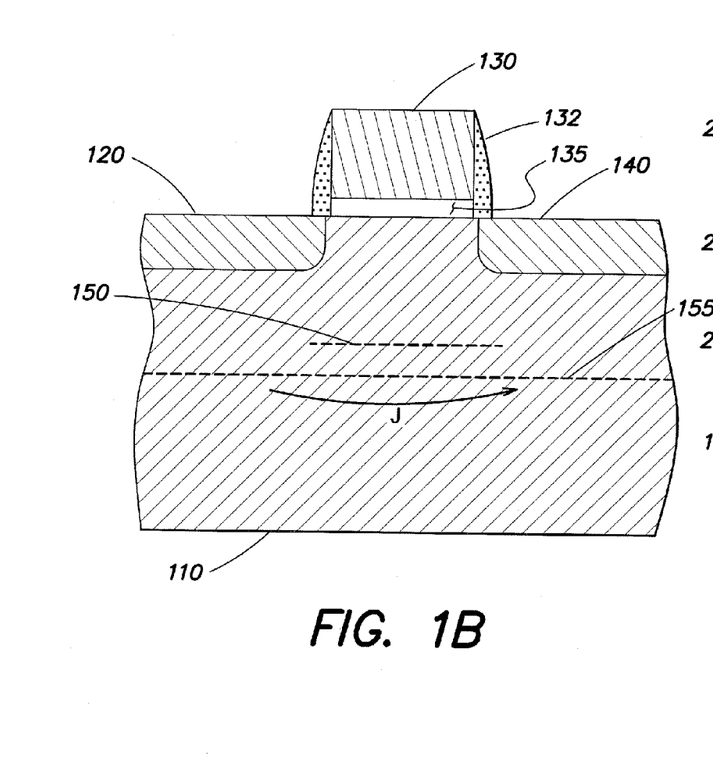
FIG. 1B is an elevation view of a portion of the finFET depicted in FIG. 1A.

FIG. 1B depicts an elevation view of a finFET through a cross-section indicated by the dashed line in FIG. 1A. In some embodiments, a gate structure of a finFET may include spacers 132. Line 155 indicates an approximate vertical extent of the fin 115, and line 150 indicates an approximate vertical extent of the gate material 130 that surrounds the fin, as depicted in FIG. 1A for example.

FinFETs have favorable electrostatic properties for complimentary MOS scaling to smaller sizes. Because the fin is a three-dimensional structure, the transistor's channel can be formed on three surfaces of the fin, so that the finFET can exhibit a high current switching capability for a given surface area occupied on substrate. Since the channel and device can be raised from the substrate surface, there can be reduced electric field coupling between adjacent devices as compared to conventional planer MOSFETs.

SUMMARY

The described technology relates to methods and structures for making finFETs that are insulated from a bulk substrate. The methods do not require the use of semiconductor-on-insulator (SOI) substrates when fabricating the finFETs. In various embodiments, the fin of the transistor is supported by an insulating layer disposed underneath the fin. The insulating layer can prevent current leakage in the device that would otherwise occur without the insulating layer.

According to one embodiment, a method for making a finFET comprises acts of depositing a sacrificial material on a substrate, depositing a first semiconductor material over the sacrificial layer, and forming a plurality of fins for one or more fin-FETs in the first semiconductor material. A method for making a finFET may further comprise removing at least portions of the sacrificial material to form first voids under the plurality of fins. In some embodiments, the voids may be subsequently filled with an insulating material that electrically insulates the fins from an underlying conductive semiconductor.

There are corresponding structures associated with the methods for making finFETs. According to one implementation, a finFET structure comprises a plurality of semiconductor fins formed for fin-FETs, wherein the plurality of fins are supported over voids between the plurality of fins and a substrate by a support structure. The voids may be produced by removal of a sacrificial material upon which the fins were formed.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. The drawings are not intended to limit the scope of the present teachings in any way.

The features and advantages of the present embodiments will become more apparent from the detailed description set forth below when taken in conjunction with the drawings.

DETAILED DESCRIPTION

Although finFETs exhibit favorable electrostatic properties for scaling to smaller sizes and can exhibit a high current switching capability for a given surface area occupied on substrate, one shortcoming of the device is current leakage in an off state through the underlying conductive substrate. For example, finFETs fabricated on bulk semiconductor substrates can exhibit current leakage in the substrate under the fin 115 structure below the gate region. Such current leakage in a finFET is depicted in FIG. 1B as current J which represents a current leakage flow between source 120 and drain 140 of the device. Although this current leakage can be very small, it is undesirable on a chip that may have millions of identical or similar finFETs.

One solution to preventing current leakage under the fin is to form the fins from a thin semiconductor layer comprising the insulated semiconductor layer of a semiconductor-oninsulator (SOI) substrate. However, the fabrication and/or use of SOI substrates can add cost to the manufacturing process.

An additional problem associated with forming finFETs from bulk semiconductor materials, whether using SOI substrates or bulk substrates, is that the fins may have variable heights on a same wafer, which can lead to different device properties, e.g., different threshold voltages $V_{th}$ or different I-V characteristics. Referring again to FIG. 1A, the height of the fin surrounded by the gate is determined by a combination of an etching step to define the fin and a subsequent deposition of the insulating layer 105. In some embodiments, the combination of the etching at high aspect ratios and subsequent deposition can lead to appreciable height variations across a semiconductor substrate.

Some of the above-described problems associated with fabrication and operation of finFETs can be avoided using methods of fabrication described below. According to some processing embodiments described herein, a finFET having an insulating layer below the fin to prevent current leakage may be formed using a bulk semiconductor substrate, rather than an SOI substrate. For example, a finFET having an underlying insulating layer may be formed starting with bulk semiconductor material in which there is no buried or underlying insulating layer. Additionally, the fins may be defined using epitaxial growth of semiconductor material, which can lead to improved uniformity of fin heights when fabricating a plurality of finFETs on a substrate.

Embodiments of processes to form multi-gate finFET devices using bulk semiconductor substrates are depicted in the process diagrams of FIGS. 2A-2G. Some of the diagrams reflect the execution of more than one process step. An example of a finFET fabricated according to the disclosed processing embodiments is depicted in FIGS. 3A-3B.

Figure 2A:
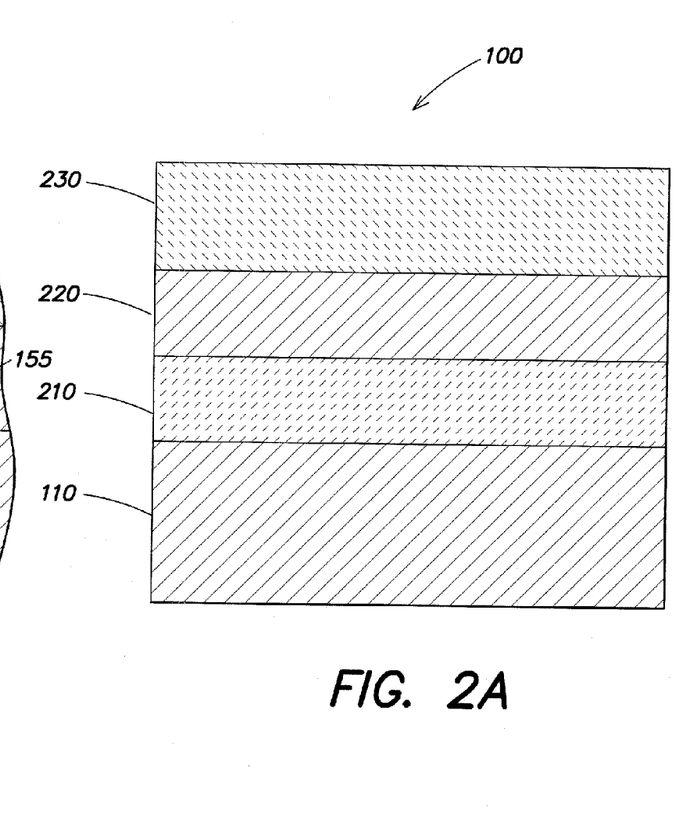
FIGS. 2A-2I depict embodiments of process steps that may be used to form a finFET having an underlying insulating layer on a bulk semiconductor substrate.
Figure 3A:
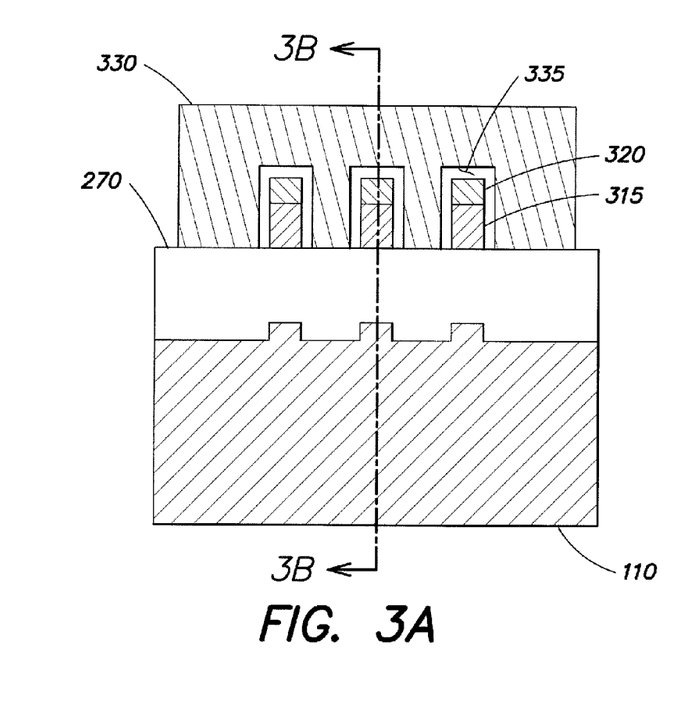
FIG. 3A depicts an elevation view of multiple insulated finFETs formed on a bulk semiconductor substrate.
Figure 3B:
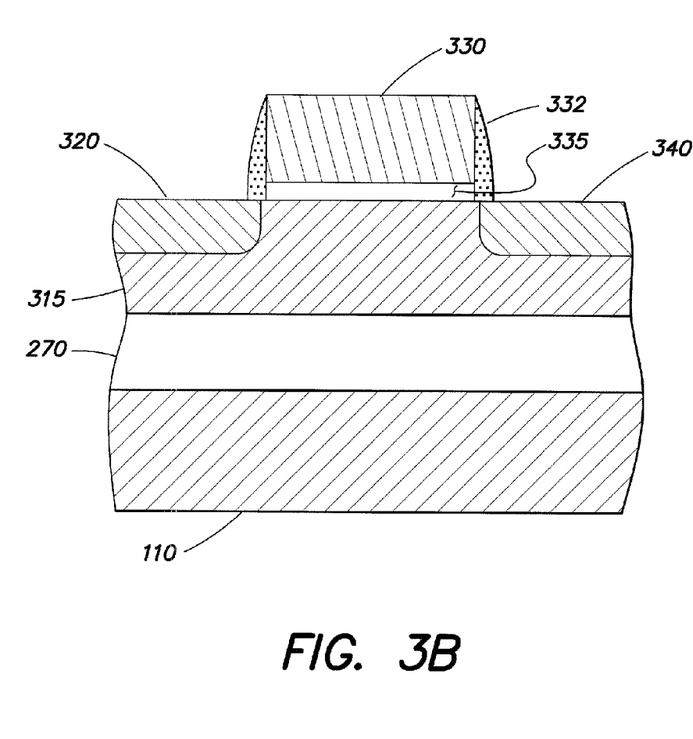
FIG. 3B depicts an elevation view of a portion of a finFET taken along the dashed line of FIG. 3A.

Referring to FIG. 2A a process for forming a multi-gate finFET having an underlying insulating layer may begin with providing or fabricating a multi-layer substrate 100. The multi-layer substrate may include a bulk semiconductor portion 110, also referred to as a "semiconductor substrate" or "substrate," and multiple layers formed on the substrate 110. The multiple layers may include, but not be limited to, a first layer 210, a second layer 220, and a mask layer 230.

In various embodiments, the substrate comprises a bulk semiconductor material of a first semiconductor type, e.g., a silicon substrate, a silicon-germanium substrate, a gallium-arsenide substrate, a silicon-carbide substrate, etc. The thickness of the substrate 110 may be any value between approximately 5 microns (μm) and approximately 2 millimeters (mm) depending upon the application. According to some embodiments, the thickness of the substrate 110 may be between approximately 20 μm and approximately 500 μm. In some embodiments, a thin substrate 110 may be supported by another material, e.g., a polymer, a ceramic, a metal, a glass, a handle wafer. In some embodiments, the substrate 110 may not be crystalline. The substrate 110 may be of any areal size used for microfabrication purposes. For example, the substrate may comprise a semiconductor wafer having a diameter equal to or greater than 50 mm in some embodiments, equal to or greater than 100 mm in some embodiments, equal to or greater than 150 mm in some embodiments, equal to or greater than 200 mm in some embodiments, and yet equal to or greater than 300 mm in some embodiments.

The first layer 210 may comprise a semiconductor material of a second semiconductor type that is different from the first semiconductor type of the substrate 110. For example, if the substrate 110 comprises bulk silicon (Si), the first layer may comprise silicon-germanium (SiGe), according to one embodiment. The first layer 210 may be a sacrificial material, in that at least a portion of the layer is subsequently removed in a process of forming a finFET. In various embodiments, the first layer 210 exhibits an etch selectivity over the substrate 110, such that the first layer may be removed by an etching process that does not appreciably remove the substrate 110 material. The thickness of the first layer 210 may be any value between approximately 10 nanometers (nm) and approximately 100 nm. In some embodiments, the thickness of the first layer is between approximately 10 nm and approximately 50 nm. According to one embodiment, the first layer is approximately 30 nm thick.

The first layer 210 may be deposited on the substrate 110 by any suitable means, e.g., by physical deposition or chemical deposition. According to some embodiments, the first layer 210 is deposited by epitaxial growth (using chemical-vapor deposition, for example), such that the first layer registers to, or is guided by, a crystalline structure of the underlying substrate 110 and provide a crystalline thin film layer on the substrate 110.

The second layer 220 may comprise a semiconductor material of a same type as the substrate 110. In some embodiments, the second layer 220 may comprise a material different from the substrate material. The second layer 220 may comprise a semiconductor material desired for a fin of a finFET transistor. Regardless of the material type for the second layer 220, the first layer 210 may also exhibit etch selectivity over the second layer 220. The thickness of the second layer 220 may be any value between approximately 10 nm and approximately 100 nm. In some embodiments, the thickness of the second layer is between approximately 10 nm and approximately 50 nm. According to one embodiment, the thickness of the second layer is approximately 25 nm.

The second layer 220 may be deposited by any suitable means, e.g., any means as described for the first layer. In some embodiments, the second layer 220 is deposited by epitaxial growth, such that it forms a thin-film crystalline layer that registers to, or is guided by, an underlying crystalline structure of the first layer 210. It will be appreciated that epitaxial growth of the second layer 220 can provide a highly uniform thickness of a selected value across the multi-layer substrate 100. A uniform thickness of the second layer can provide higher uniformity of resulting fin structures for finFETs as compared to a process which relies on etching to define fin structure height in bulk substrates.

The mask layer 230 may be deposited over the second layer 220. The mask layer may comprise a hard mask (e.g., a metal, an oxide, a nitride) in some embodiments, and may comprise a resist or baked resist in other embodiments (e.g., a photo-sensitive polymer). According to one embodiment, the mask layer comprises silicon nitride (SiN). In various embodiments, the mask layer exhibits etch selectivity over at least the second layer 220 and the first layer 210. The mask layer 230 may also exhibit etch selectivity over the substrate 110. The thickness of the mask layer 230 may be any value between approximately 10 nm and approximately 10 microns. In some embodiments, the thickness of the mask layer is between approximately 20 nm and approximately 100 nm. According to one embodiment, the thickness of the mask layer is approximately 40 nm.

Figure 2B:
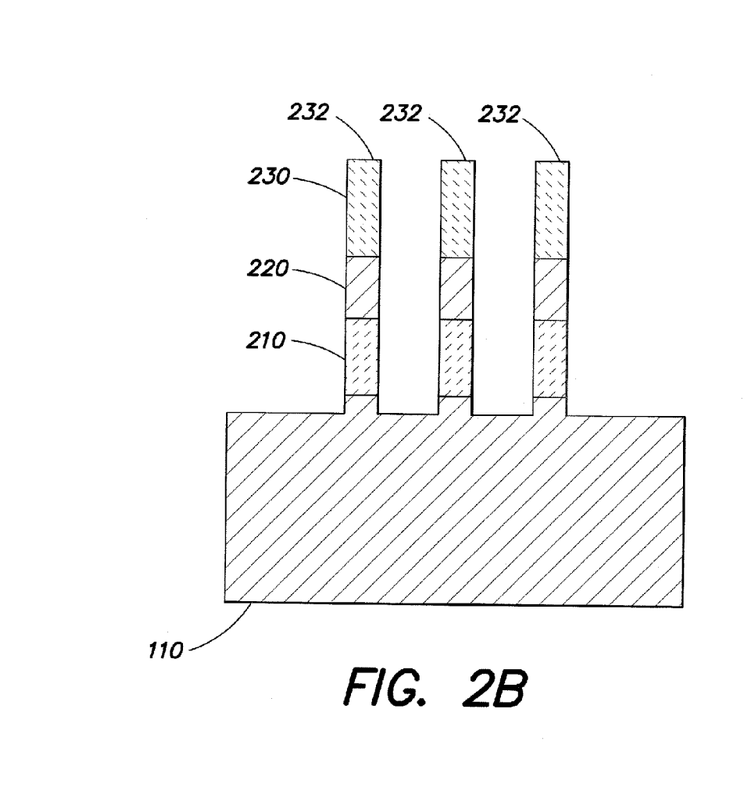

A process for forming a multi-gate finFET having an underlying insulating layer may include patterning the mask layer 230 and etching into the second layer 220 and first layer 210. A resulting structure is depicted in FIG. 2B. As an example, the mask layer 230 may be patterned (e.g., using photolithography processes) to form strips 232 of remaining mask layer that run along the surface of the multi-layer substrate. These strips may provide an etch mask for etching into the underlying layers. In various embodiments, the strips 232 provide an etch mask for fins of the finFET devices.

The formed fins 220 may have a width between approximately 10 nm and approximately 150 nm in some embodiments. The widths of the fins may be uniform to within ±15% or less. In some embodiments, the formed fins 220 may have a width between approximately 10 nm and approximately 50 nm. According to some embodiments, the formed fins 220 may have a width of approximately 30 nm. The spacings between fins may be uniform or non-uniform. The spacings between fins may be any value between 20 nm and 1 micron or more. In some embodiments, the spacings between fins may be between approximately 50 nm and approximately 300 nm.

The etching into the second layer 220 and first layer 210 may be an anisotropic etch, e.g., reactive ion etching in a low pressure plasma. Any suitable etching process may be used that provides substantially vertical sidewalls on the etched features. The etching may proceed through the second layer 220 and substantially to the bottom of the first layer 210. In some embodiments, the etch may proceed past the bottom of the first layer 210 and into the substrate 110.

Figure 2C:
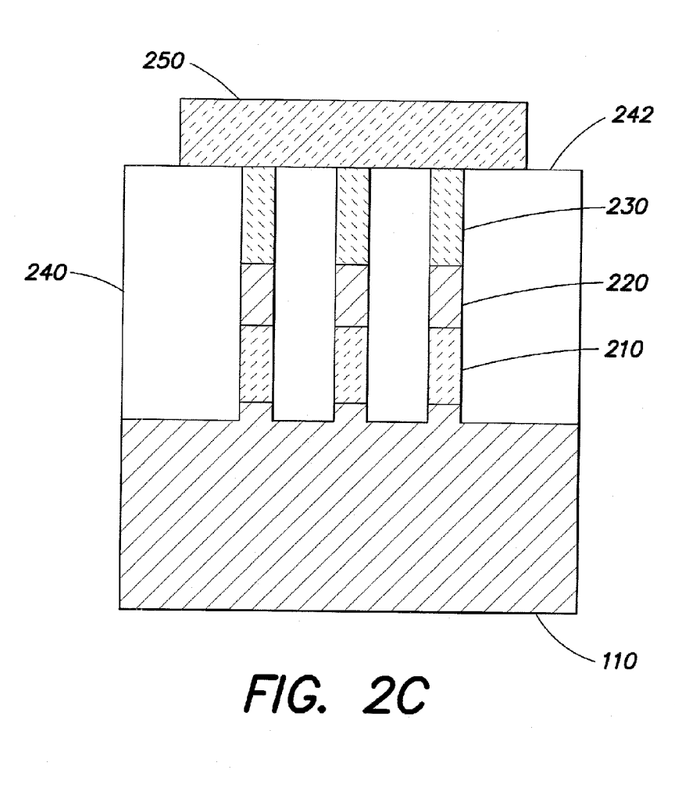

Following the etching of the second and first layers, a filling material 240 may be deposited on the patterned multi-layer substrate, as depicted in FIG. 2C. The filling material may be any suitable material that exhibits etch selectivity over at least the mask layer material 230, the second layer material 220, and the first layer material 210. In some embodiments, the filling material 240 additionally exhibits etch selectivity over the substrate 110. According to one embodiment, the filling material comprises an oxide (e.g., a silicon-oxide deposited by a high-aspect-ratio process (HARP)).

The filling material may be deposited to completely cover the etched features, e.g., to a height approximately equal to or greater than the fin structures shown in FIG. 2B. If the filling material 240 is deposited to a height greater than the fin structures, the resulting structure may be etched back and/or polished (e.g., using chemical-mechanical polishing (CMP)) to form a planar surface 242. The planar surface 242 may be formed such that the CMP process stops at approximately the top of the mask layer material 230. In some embodiments, a portion of the mask layer material may be removed during the CMP process. In some embodiments, the planar surface 242 may be formed near and above the top of the mask layer material.

A subsequent mask layer 250 may be deposited and patterned over the filling material 240. The subsequent mask layer 250 may exhibit etch selectivity over the filling material 240, and may or may not exhibit etch selectivity over any of the mask layer 230, the second layer 220, the first layer 210, and the substrate 110. The subsequent mask layer may comprise hard mask material or a resist. According to one embodiment, the subsequent mask layer 250 comprises amorphous silicon. The thickness of the subsequent mask layer may be any value between approximately 10 nm and approximately 10 microns. In some embodiments, the thickness of the subsequent mask layer is between approximately 20 nm and approximately 100 nm. According to some embodiments, the thickness of the subsequent mask layer is approximately 40 nm.

Figure 2D:
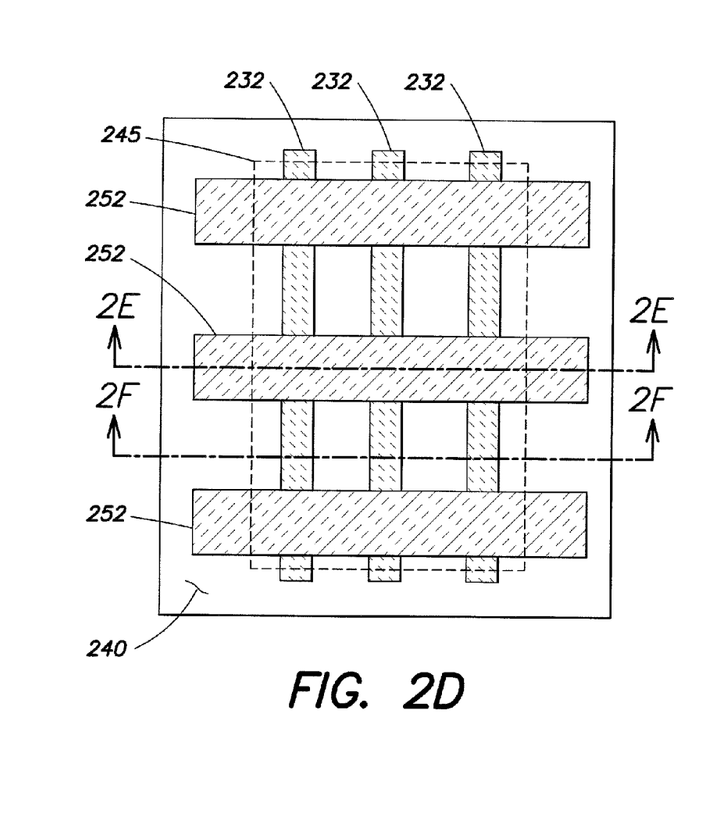

The subsequent mask layer 250 may be patterned into strips oriented at an angle with respect to the fin structures shown in FIG. 2B. According to one embodiment, the subsequent mask layer is patterned as pseudo-gate structures 252, as depicted in FIG. 2D. The pseudo-gate structures may cross one or more fin structures, as depicted in the drawing. The pseudo-gate structures may cross a fin structure at approximately a 90-degree angle, although crossings at other angles may be implemented. In some embodiments, the fin structures may be arranged in groups (e.g., groups of two, groups of three, groups of any number), and a pseudo-gate structure may cross one or more groups.

When the subsequent mask layer 250 is patterned as pseudo-gate structures, an optical lithography photomask or reticle that is normally used to pattern gates for the finFETs may also be used to pattern the pseudo-gate structures. Multiple use of the photomask avoids an added cost of an additional mask. In other embodiments, a different photomask having less strict design rules than a gate mask may be used for patterning the pseudo-gate structures 252.

Figure 2E:
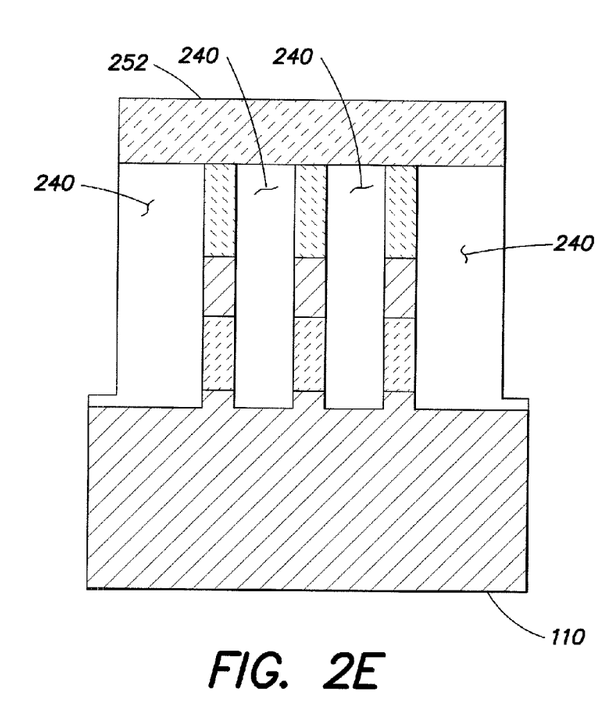
Figure 2F:
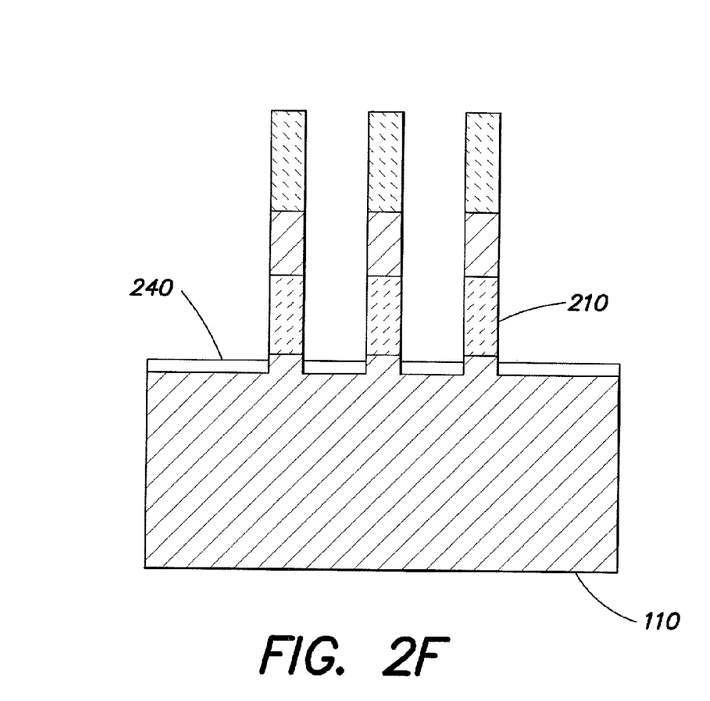

The multi-layer structure of FIGS. 2C and 2D may be etched to form the structures depicted in FIGS. 2E and 2F, according to one embodiment. The dashed lines in the plan view of FIG. 2D indicate the locations of cross sections for the elevation views of FIGS. 2E and 2F. The etching may remove the filling material 240 in exposed regions that are not covered by the pseudo-gate structures 252. The etching to remove the filling material 240 may be any suitable anisotropic etch. The etching may remove substantially all of the filling material 240 in exposed regions, though some filling material may remain as shown in FIG. 2F. In some embodiments, all of the filling material is removed in the exposed regions.

As depicted in FIG. 2F, in some regions of the substrate the fin structures become exposed following the etching. In other regions of the substrate, the filling material is not removed, and the fin structures are locally supported be a combination of the filling material 240 and pseudo-gate structures 252, as depicted in FIG. 2E, for example.

In some embodiments, the structure depicted in FIGS. 2E and 2F, may be subjected to a short oxide removal etch, e.g., chemical oxide removal (COR) etch, that may remove an residual or formed oxide on the exposed surface of the first layer 210. The structure may then be subjected to a selective etch that removes the first layer material 210 in the exposed regions depicted in FIG. 2F. The selective etch may be anisotropic, e.g., a high-pressure plasma etch or a wet chemical etch. According to some embodiments, the selective etch comprises a hydrochloric acid etch. The selective etch may also remove at least some of the first layer material in the regions depicted in FIG. 2E, in some embodiments. After the removal of the first layer material, the fin structures in FIG. 2F (comprising the remaining second layer 220 and mask layer 230) become suspended structures with voids between the suspended structures and the substrate 110. Because the regions in FIG. 2E have filling material 240 and pseudo-gate structures 252, they provide support to the suspended fin structures in FIG. 2F.

Figure 2G:
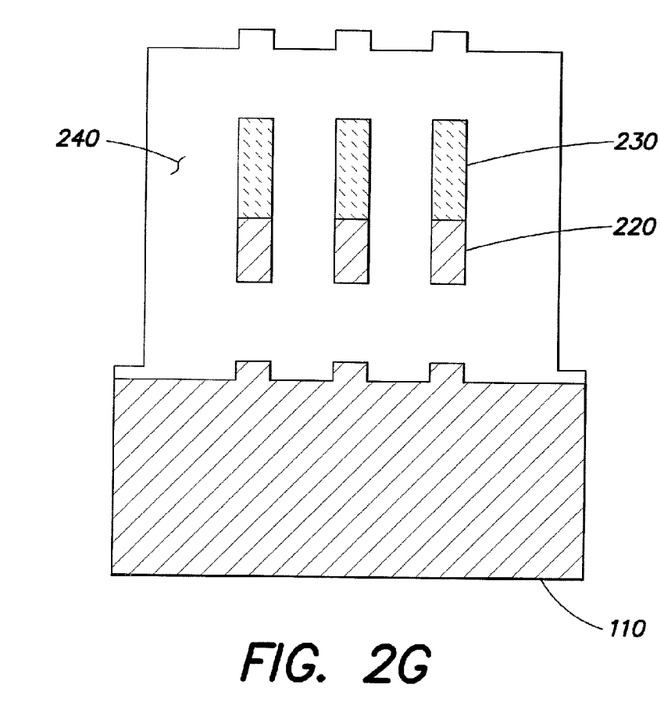

A deposition process may then be carried out to fill the voids and regions around the suspended fin structures to provide a structure as depicted in FIG. 2G. The voids may be filled with an insulating material, e.g., a silicon-oxide. Any suitable insulating material may be used to insulate the second layer material from the substrate 110. According to one embodiment, the insulating material 240 is a silicon dioxide deposited by a HARP procedure that is substantially the same material and process used to deposit the filling material 240 indicated in FIG. 2C. The insulating material may cover the fin structures as depicted in FIG. 2G.

After deposition of the insulating material, the processed substrate may be annealed to improve the quality of the HARP-deposited material. As an example, the HARP oxide may be annealed using a shallow trench isolation (STI) annealing process.

Figure 2H:
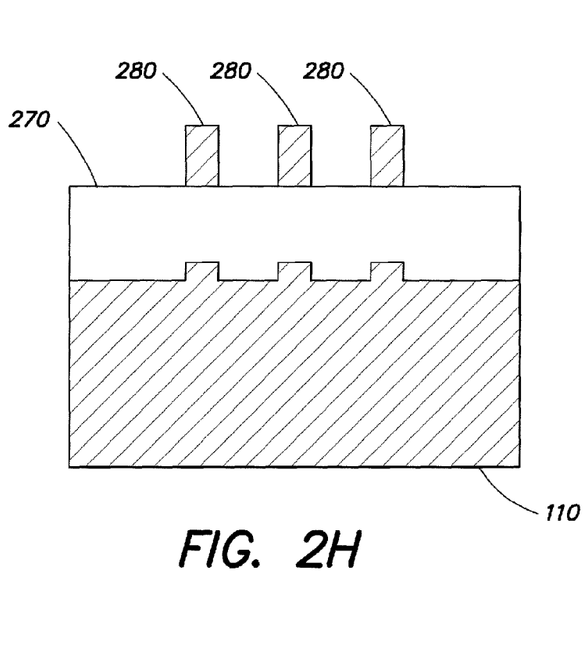

Etching and/or polishing may be carried out to remove the pseudo-gate structures 252, mask material 230 and a portion of the insulating material 240, so as to expose the fin structures 280 in the first layer material 210. The removal processes may include a chemical-mechanical polishing (CMP) step that planarizes the surface and stops at approximately the mask material 230 of the fin material 220. Subsequent etching, e.g., RIE etching, may be used to remove the mask material and/or insulating material, so that the fins 280 become exposed as indicated in FIG. 2H. In the resulting structure, as depicted in FIG. 2H, the fin structures have an underlying insulating layer 270, that electrically insulates the fin structures from the semiconductor substrate 110.

Figure 2I:
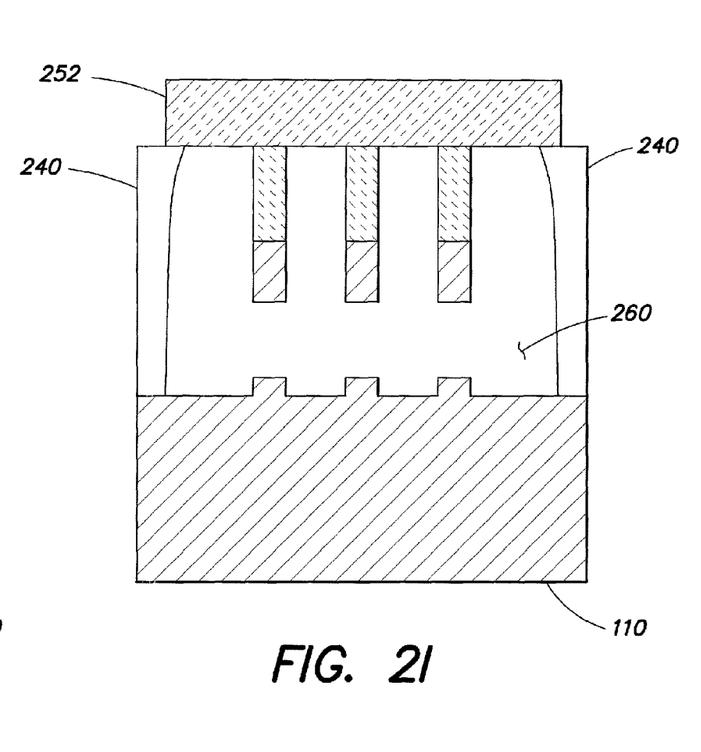

FIG. 2I depicts a structure obtained in an alternative embodiment of a process for forming a multi-gate finFET having an underlying insulating layer. In this embodiment, an etching step to remove filling material 240 may comprise an isotropic etch of an exposed region indicated by the dotted box 245 in FIG. 2D. A resist (not shown) may be patterned over the structure shown in FIG. 2C to define the exposed region indicated by the dotted box 245. An isotropic etch, a semi-anisotropic etch, or combination of isotropic and anisotropic etches may be used to remove filling material below the exposed region and, in some cases, below the pseudo-gate structures 252 to create a void region 260. The pseudo-gate structures may still be anchored by remaining filling material 240 and provide support to the suspended fin structures. Filling material 240 may be subsequently deposited, and the overall structure polished and/or etched to yield the structure depicted in FIG. 2H.

After obtaining a structure as depicted in FIG. 2H, finFET process steps may be carried out to form finFETs from the fin structures 280. For example, an insulated gate structure may be formed over one or more fins, as depicted in FIG. 3A. An insulated gate structure may comprise an thin insulator 335 (e.g., an oxide) and gate conductor 330 deposited over the fin structures 280. The insulator 335 may be a thermal oxide in some embodiments, or a vapor deposition oxide which may be subsequently annealed.

A gate conductor 330 may be deposited over the oxide, and subsequently patterned and etched to form a gate structure. A gate structure may be patterned as a strip that serves as a gate for more than one fin structure 280. The gate conductor may comprise any suitable conductive material, e.g., polysilicon, a metal. The patterned gate conductor 330 may serve as a mask for removing exposed regions of oxide 335 from fin portions adjacent to the gate structure.

Source and drain portions 320, 340 of the fins may be formed after forming the gate structures. In some embodiments, source and drain regions are formed by a self-aligned, ion-implantation process in which the gate conductor 330 serves as a mask for ion implantation. In some implementations, spacers 332 may be formed adjacent the gate structures, as depicted in FIG. 3B. The spacers may be formed of any material (e.g., a nitride or oxide) suitable for blocking ions during an ion implantation process. The source and drain portions 320, 340 may extend part way into the fin 315 in some embodiments, and may extend to the bottom of the fin in other embodiments. The fin 315 may be of a first conductivity type (e.g., a P-type or N-type semiconductor), and the source and drain portions 320, 340 may be of a second opposite conductivity type (e.g., an N-type or P-type semiconductor, respectively).

A passivation layer (not shown) may be deposited over the devices shown in FIGS. 3A-3B, and gate, source and drain contacts formed through the passivation layer. Regardless of how the gate structure and contacts are formed, the resulting finFET comprises an active finFET device that is supported by an underlying insulating layer 270. For example, each finFET sits on the insulating layer 270. With reference to FIG. 1B, the insulating layer 270 prevents the flow of leakage current J that would otherwise occur underneath the fin in a bulk semiconductor substrate. Further the underlying insulating layer was formed below the fin structures to insulate the finFETs from the substrate, even though the process started with a bulk semiconductor substrate. The process does not require use of an SOI wafer.

It may be appreciated that that above-described processes for forming finFETs can provide uniform fin heights over the area of a chip or wafer, since the height of the fin structures 280 is initially determined by epitaxial growth or a suitable deposition process. Epitaxial growth can be a well-controlled process that provides highly uniform fin heights over large areas. For example, over the area of a chip, the fin heights may vary by less than ±15% in some embodiments, less than ±10% in some embodiments, less than ±5% in some embodiments, and yet less than ±2% in some embodiments. Additionally, some of the deposition and etching steps used in the disclosed embodiments have wide process margins, since these steps are not specifically used to define a height of a fin. For example, deposition and etching of the filling and insulating material 240 may have wide process latitude, since the height of the fins is defined before these steps. Also, the etching of the first and second semiconductor materials 210, 220 may have wide latitude, since over-etching into the substrate 110 (as in FIG. 2B) does not matter in terms of the performance of the finFET.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A fin-FET structure comprising a plurality of fins formed for a plurality of fin-FETs, wherein first portions of the plurality of fins that are over voids between the plurality of fins and a substrate are supported by a support structure adjacent the first portions.

2. The structure of claim 1, wherein the substrate comprises a bulk semiconductor.

3. The structure of claim 1, wherein the plurality of fins comprise epitaxially grown semiconductor.

4. The structure of claim 1, wherein the support structure comprises pseudo-gate structures.

5. The structure of claim 4, wherein the pseudo-gate structures are supported by a filling material that is deposited over second portions of the plurality of fins.

6. The structure of claim 1, wherein the support structure comprises amorphous silicon.

7. The structure of claim 1, further comprising a hard mask material disposed between the plurality of fins and the support structure.

8. The structure of claim 1, wherein the first layer comprises a second semiconductor material and the depositing of the first layer comprises epitaxially growing the second semiconductor material.

9. The structure of claim 1, wherein the plurality of fins comprise Si.

10. The structure of claim 1, wherein the plurality of fins have a height between approximately 10 nm and approximately 70 nm.

11. The structure of claim 10, wherein the height of the plurality of fins is uniform to within ±15%.

12. The structure of claim 1, wherein a width of a fin of the plurality of fins is between approximately 10 nm and approximately 150 nm.

13. The structure of claim 1, wherein a spacing between fins of the plurality of fins is greater than approximately 20 nm.

\* \* \* \* \*